United States Patent

Rinehart et al.

[19]

[11] Patent Number: 5,926,372
[45] Date of Patent: Jul. 20, 1999

[54] POWER BLOCK ASSEMBLY AND METHOD OF MAKING SAME

[75] Inventors: Lawrence Edward Rinehart, Milpitas, Calif.; Venkateswara Anand Sankaran, Dearborn, Mich.; Walter Noll, Cottage Grove, Oreg.

[73] Assignees: Ford Global Technologies, Inc., Dearborn, Mich.; SemiPower Systems, Inc., San Jose, Calif.

[21] Appl. No.: 08/996,641

[22] Filed: Dec. 23, 1997

[51] Int. Cl.⁶ ...................................................... H05K 7/20
[52] U.S. Cl. .......................... 361/704; 361/707; 361/719; 257/706; 257/717; 257/712
[58] Field of Search ..................................... 361/600, 679, 361/686, 687, 688, 701, 702, 703, 704, 707, 713, 714, 715, 717–720, 722–723; 257/666, 668, 669, 675, 706, 707, 717–719; 174/16.3; 165/80.2, 80.3

[56] References Cited

U.S. PATENT DOCUMENTS

| | | | |
|---|---|---|---|
| 5,398,160 | 3/1995 | Umeda | 361/707 |
| 5,446,318 | 8/1995 | Koike et al. | 257/707 |
| 5,459,639 | 10/1995 | Izumi | 361/707 |
| 5,536,972 | 7/1996 | Kato | 257/706 |
| 5,640,304 | 6/1997 | Hellinga et al. | 361/707 |
| 5,754,402 | 5/1998 | Matsuzaki et al. | 361/707 |

*Primary Examiner*—Leo P. Picard
*Assistant Examiner*—Boris L. Chervinsky
*Attorney, Agent, or Firm*—Raymond L. Coppiellie; Roger L. May

[57] ABSTRACT

A substrate assembly for use with a high power switching module includes at least one power block having a base plate for providing mechanical rigidity for the power block. The power block also includes at least one silicon die mounted onto the base plate and configured to form at least one high power switching transistor having leads extending away therefrom. The power blocks are then supportably mounted into corresponding apertures in a rigid frame which mounts the power switching module onto a heat dissipating surface and tested independently before mounting into the frame at full load current and power, which cannot be performed at the bare die level.

18 Claims, 4 Drawing Sheets

POWER BLOCK ASSEMBLY AND METHOD OF MAKING SAME

CROSS-REFERENCE TO RELATED APPLICATIONS

This invention relates to co-pending applications entitled "High Power Switching Module And Method Of Making Same," and "Isolated Gate Driver For Power Switching Devices and Method For Carrying Out Same," which are assigned to the assignees and have the same filing date as the present application.

1. Technical Field

This invention relates to power blocks for use in high power density modules.

2. Background Art

High power density modules are modules that interface between a controller or digital computer, such as a microcontroller, and a motor for controlling the motor, or other power electronic systems (e.g. uninterruptible power supply, battery chargers, electroplating systems, etc.). High power density modules typically include high power switching elements, such as transistors and diodes, and gate drivers for driving the transistors, which in turn drive the motor or load. These high power density modules generally have an electrically isolated case and base plate for ease of mounting the module to a heat removal source. Different methods and technologies are available to implement the transistors. The technology is chosen depending on the power rating of the module and the power loss it must be capable of dissipating. The packaging issues that affect the electrical characteristics, thermal ratings and reliability of the module include proper design of the layout (current flow path) to minimize stray inductance. This has a direct impact on the switching losses, device ratings and EMI issues.

Furthermore, proper selection of the materials in the power block and minimizing the number of layers and interfaces helps in reducing the thermal resistance of the module. Use of high thermal conductivity materials helps in reducing the thermal resistance. The materials chosen for the various layers should be such that there is very little mismatch in their coefficient of thermal expansion. This helps to reduce the stresses at the interfaces and this in turn would increase the life of the module. However, semiconductors, insulators and metals have widely different properties and hence complicate the selection process.

There are several power modules available. Each of these devices is built using conventional techniques and use either ceramics or polyimides (IMS) for isolation on a single copper or aluminum base plate. There are limits on the size of the modules that can be built using these techniques due to manufacturing issues and yield problems, especially where multiple power semiconductor die must be paralleled. Because each die attach/wirebond has finite yield, the yield loss rises exponentially with the number of die and wirebonds. Moreover, in this approach the silicon dies, high current traces, and interconnects are all laid out in the same level which requires a lot of real estate, i.e., large base plates and substrates. Large base plates and substrates cause problems in manufacturing, reliability, cost, and increase in stray inductance.

Thus, there exists a need for a compact, inexpensive power module design that allows for pretesting of specific components of the power module, such as the high power switching transistors, in order to achieve high final test yields.

DISCLOSURE OF THE INVENTION

It is thus a general object of the present invention to provide transistor assemblies for use with high power switching modules that allow for pretesting of the transistors prior to final assembly and allow for flexibility in the design of the high power switching module.

In carrying out the above object and other objects, features, and advantages of the present invention, a power block assembly for use with a high power density module includes a base plate for providing mechanical rigidity for the assembly. The assembly also includes at least one silicon die mounted onto the base plate and configured to form at least one high power switching transistor having leads. The assembly can then be supportably mounted into a frame, and tested independently before mounting into the frame at full load current and power. Typically, the full load current and power cannot be performed at the bare die level.

In further carrying out the above object and other objects, features, and advantages of the present invention, a method is also provided for making the above described power block assemblies. The method includes the step of providing at least one power block including a base plate providing mechanical rigidity for the power block and at least one silicon die mounted onto the base plate and configured to form at least one high power switching transistor having leads extending away therefrom. The method also includes the step of providing a rigid frame having at least one aperture and having a top surface and a bottom surface, wherein each of the apertures include a first opening at the top surface and a second opening at the bottom surface, the first opening being slightly larger than the second opening. The method further includes inserting the at least one power block into the at least one aperture of the rigid frame.

The above object and other objects, features and advantages of the present invention are readily apparent from the following detailed description of the best mode for carrying out the invention when taken in connection with the accompanying drawings.

BEST MODES FOR CARRYING OUT THE INVENTION

Figure 1:
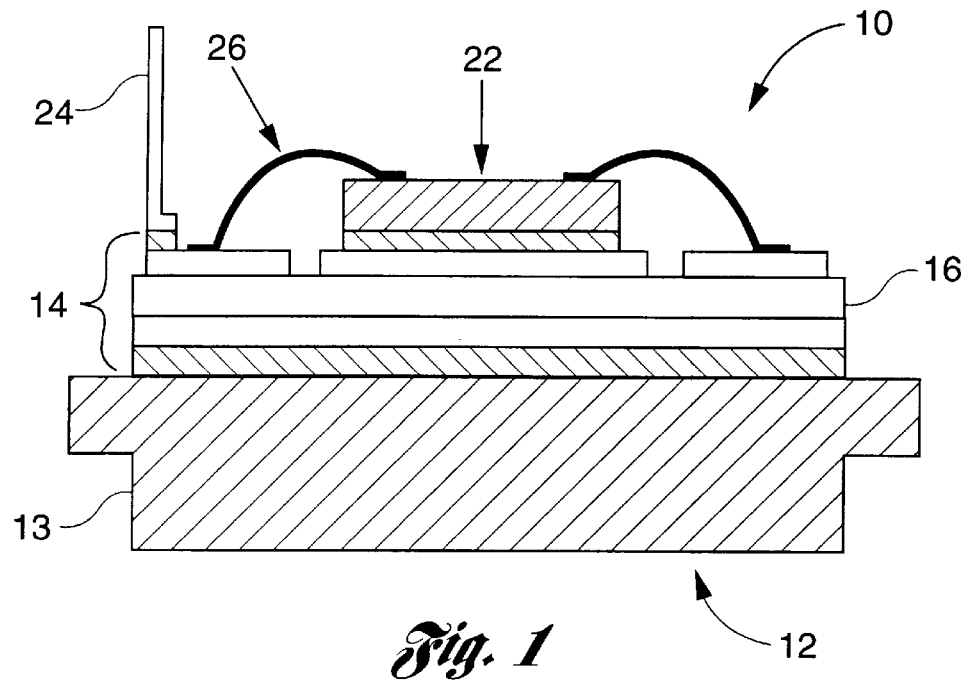
FIG. 1 is a cross-sectional view of the power block of the present invention.

The present invention addresses a unique approach to building high power density modules. One or more power blocks are inserted into a rigid frame of the module. Turning now to FIG. 1, there is shown a cross-sectional view of the power block of the present invention, denoted generally by reference numeral 10. The power block 10 includes a copper base plate 12 providing mechanical rigidity for the power block 10 and including a step 13. The copper base plate insures the power block 10 makes good contact with a heat sink (not shown), which disperses the heat generated by the power block 10. The copper base plate is typically 1 to 3 mm thick.

Figure 2:
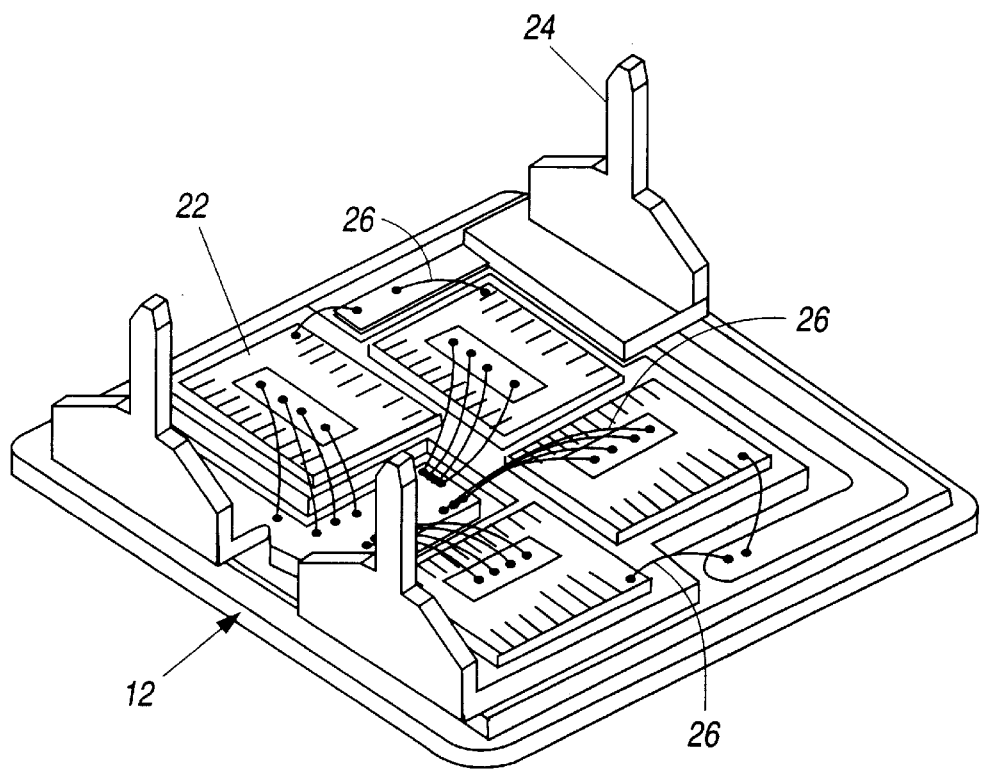
FIG. 2 is a perspective view of the power block of the present invention.

An insulating substrate 14 having an insulating layer 16, such as ceramic or polyimide, provides electrical isolation between the base plate 12 and the drain of the transistor. If ceramic is used, the insulating layer 16 includes a printed and fired or direct bonded metal land patterns on its top and bottom surfaces. If a polyimide substrate is utilized, the insulating layer 16 has a copper clad on its top surface to facilitate the mounting and interconnection of the silicon dies 22 and lead frames 24 (FIG. 2).

The substrate material is chosen based on conflicting requirements, such as thermal conductivity, mechanical strength, cost, availability and disposal concerns. Preferably, a Direct Bond Copper Aluminum Nitride (DBC AlN), with a thermal conductivity of 170 W/m-°K or more, is utilized as the substrate material.

The power block 10 may include one or more conventional silicon dies 22 depending on the desired configuration to form at least one transistor. For example, two silicon dies 22 may be connected in parallel to form a high current transistor, where the gate, drain and source of each die 22 is connected to the gate, drain and source of the other die(s) 22. Thus, these dies 22 may be parallel-connected MOSFETs, bipolar transistors, or IGBT dies with one or more anti-parallel freewheeling rectifier diode die. Aluminum wires 26 interconnect each of the silicon dies 22 to form the at least one transistor, as shown in FIG. 2, having corresponding lead frames 24.

Figure 3A:
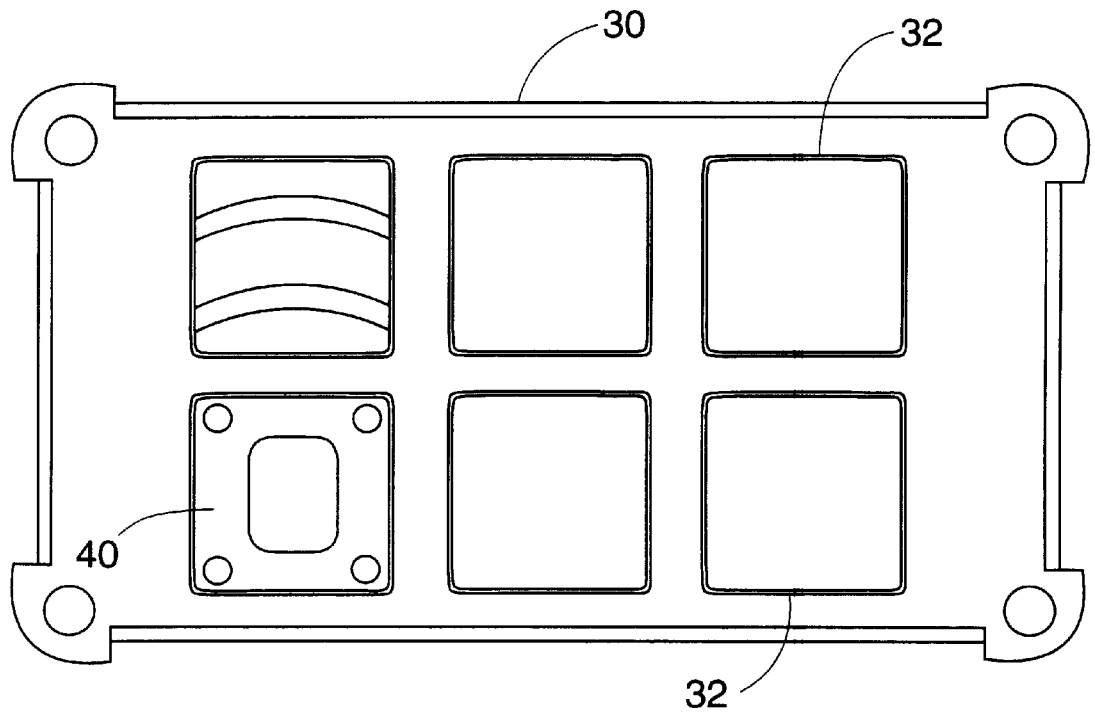
FIGS. 3a and 3b are top and side views of the rigid frame of the present invention.
Figure 3B:
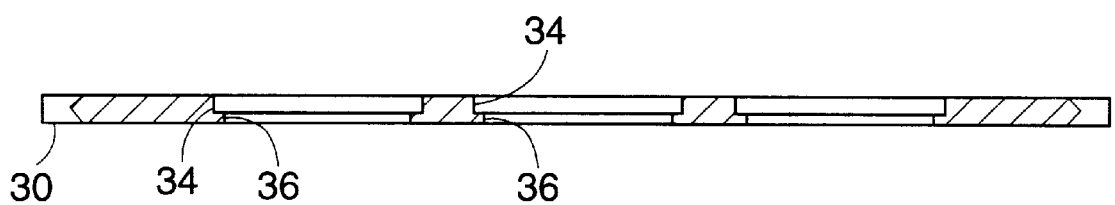

The power blocks 10 are inserted into a rigid frame 30, as shown in FIGS. 3 and 4. The rigid frame 30 includes apertures 32 having first and second opening steps 34, 36, respectively, for receiving and supporting the power blocks 10 therein. The first opening 34 is slightly larger than the second opening 36 to insure the power blocks 10 are supported therein by having the step 13 in base plate 12 engage in the step 36. The depth of the first opening step 34, however, is substantially larger than the depth of the second step 36 so that the bottom surface of the base plate 12 of power block 10 comes into contact with the heat sink or heat exchanger (not shown) associated with the power module when the power module is mounted to the heat sink. Preferably, the depth of the steps 34, 36 are configured so that the power block 10 protrudes in the order of 3 to 5 mils ($\leq 0.125$ mm).

Figure 4A:
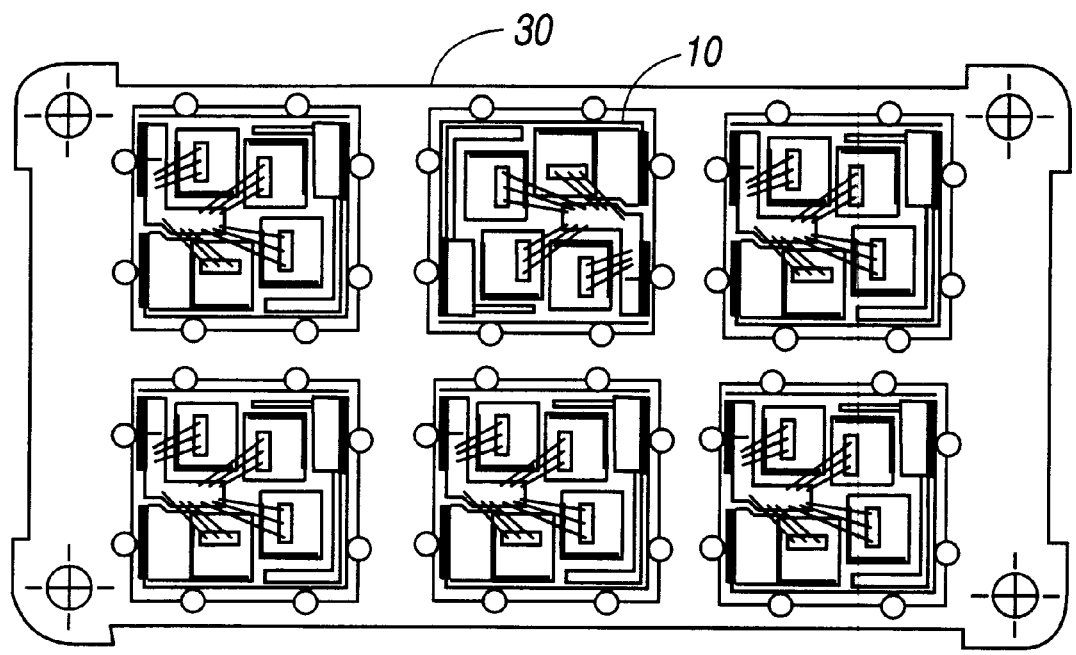
FIGS. 4a and 4b are top and side views of the rigid frame incorporating several power blocks.
Figure 4B:
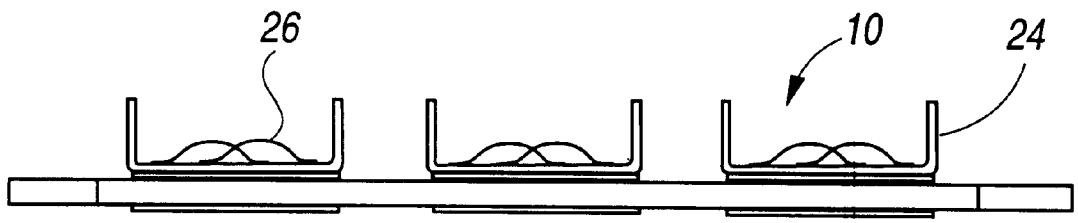

The power blocks 10 may be rigidly mounted by coining or welding techniques into the base frame 30, as shown in FIGS. 4a and 4b, or they may be suspended in the frame 30 using flexible gaskets 40, as shown in FIG. 4a.

Figure 5:
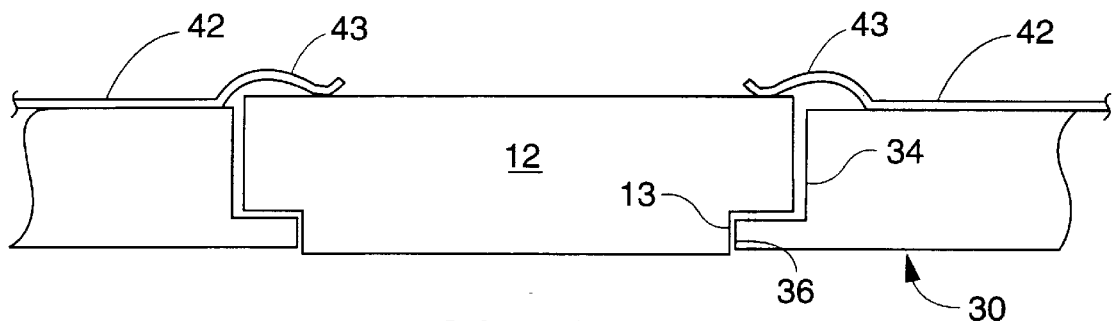
FIG. 5 is a cross-sectional view of one embodiment of the rigid frame of the present invention incorporating pressure plates.
Figure 6:
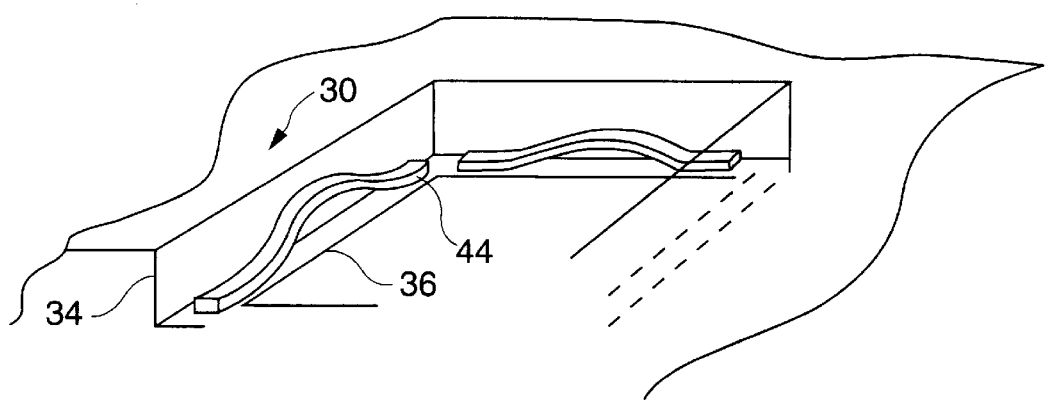
FIG. 6 is a top view of an alternative embodiment of the rigid frame of the present invention incorporating leaf springs.
Figure 7:
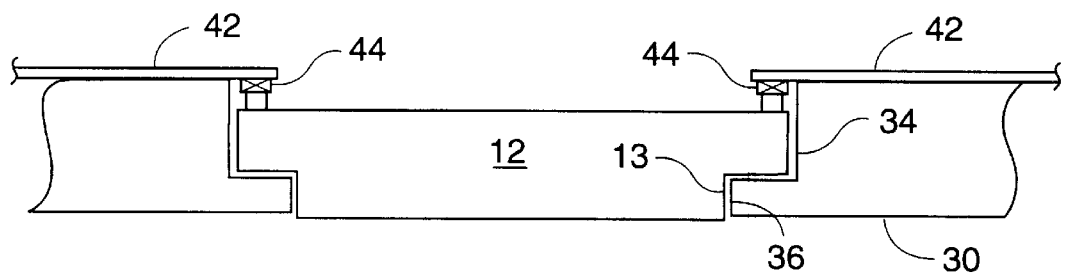
FIG. 7 is a cross-sectional view of the rigid frame shown in FIG. 6 including pressure plates.

Alternatively, the power blocks 10 may be suspended in the frame 30 via pressure plates 42 alone or in combination with leaf springs 44, as shown in FIGS. 5–7. As shown in FIG. 5, the pressure plates 42 have at least one formed spring finger 43 for pushing the power block base 12 such that it will contact the heat sink or load. Leaf springs 44, such as the type shown in FIG. 6, may be used in conjunction with the pressure plates 42, as shown in FIG. 7. In this case, the pressure plates 42 are flat so they compress the leaf springs 44, or any other similar elastomer spring gasket, so as to force the power block base 12 to protrude through the frame 30 to make contact with the heat sink or load. The suspended power blocks 10 can then move independently to establish a good contact with the heat sink, which is essential for good heat flow.

The lead frames 24 of each of the power blocks 10 can then be interconnected with an interconnect assembly, such as the type disclosed in "High Power Switching Module and Method of Making Same," for use in a high power switching module.

The frame 30 is not limited to standard (flat) base plate mounting, but lends itself to liquid-cooling and integral forced-convection cooling systems. The frame 30 may be of any appropriate shape, such as a curved frame, and thus can be mounted to another heat exchanger or structure for cooling without special adapters.

The ratings of the high power density module can be easily changed by changing the silicon die 22 in the power block 10, i.e., the devices may be MOSFETs, IGBTs, BJTs, diodes or any combination of these, and the number of dies may range from one to as many as necessary to achieve the required rating. The rest of the module can remain the same so as to provide the flexibility in the design of the high power density module.

Thus, the power blocks of the present invention can be configured depending on the switch ratings required of the power module, thus, providing flexibility in the design of the power module. Furthermore, the power blocks can be completely tested before final assembly of the module so as to aid in achieving extremely high final yields minimizing the costs associated with failed components.

While the best modes for carrying out the invention have been described in detail, those familiar with the art to which this invention relates will recognize various alternative designs and embodiments for practicing the invention as defined by the following claims.

What is claimed is:

1. A power block assembly for use with a high power switching module, the power block assembly comprising:
   a base plate for providing mechanical rigidity for the assembly;
   at least one silicon die mounted onto the base plate and configured to form at least one high power switching transistor having leads extending away therefrom and interconnecting with at least one other power block assembly to form the high power switching module, wherein the at least one high power switching transistor can be tested independently of other high power switching transistors; and
   a rigid frame having an aperture for receiving and supporting the power block assembly therein, wherein the rigid frame includes a top and bottom surface, the top surface for receiving the power block assembly and the bottom surface for mounting the high power switching module onto a heat exchanger that disperses heat generated by the power block, and wherein the aperture includes a first opening at the top surface and a second opening at the bottom surface, the first opening being slightly larger than the second opening so as to support the power block assembly therein.

2. The assembly as recited in claim 1 wherein the base plate has a top and bottom surface, the top surface having a length greater than a length of the bottom surface and the top surface having a first depth and the bottom surface having a second depth, wherein die first opening of the aperture of the rigid frame has a first depth corresponding to at least the first depth of the top surface of the base plate and having a second depth corresponding to at least the second depth of the bottom surface of the base plate, wherein the first depth of the fist opening is substantially larger than the second depth of the second opening so as to insure the rigid frame allows the power block assembly to make contact with the heat exchanger by allowing the power block to protrude from the bottom surface of the rigid frame.

3. The assembly as recited in claim 1 further comprising a mounting interface for suspending the power block assembly in the rigid frame and for forcing the power block assembly to protrude from a bottom surface of the rigid frame.

4. The assembly as recited in claim 3 wherein the mounting interface is a flexible gasket.

5. The assembly as recited in claim 3 wherein the mounting interface is at least one leaf spring.

6. The assembly as recited in claim 3 wherein the mounting interface is at least one spring pressure plate.

7. The assembly as recited in claim 1 wherein the top and bottom surfaces of the rigid frame are parallel planar surfaces for facilitating mounting to a flat surface.

8. The assembly as recited in claim 1 wherein the top and bottom surfaces of the rigid frame are parallel surfaces shaped to facilitate mounting to a non-flat surface.

9. The assembly as recited in claim 1 further comprising an isolating substrate disposed between the base plate and the at least one silicon die for providing electrical isolation between the base plate and the at least one silicon die.

10. A substrate assembly for use in a high power switching module, the assembly comprising:

at least one power block assembly each having a base plate for providing mechanical rigidity for the power block assembly and each having at least one silicon die mounted onto the base plate and configured to form at least one high power switching transistor having leads extending away therefrom and interconnecting with at least one other power block assembly to form the high power switching module, wherein the at least one high power switching transistor can be tested independently of other high power switching transistors; and a rigid frame having at least one aperture for receiving and supporting the at least one power block assembly therein.

11. The assembly as recited in claim 10 wherein the rigid frame includes a top and bottom surface, the top surface for receiving the power block assembly and the bottom surface for mounting the high power switching module onto a heat sink that dispenses heat generated by the power block assembly, wherein each of the apertures include a first opening at the top surface and a second opening at the bottom surface, the first opening being slightly larger than the second opening so as to support the power block assembly therein.

12. The assembly as recited in claim 11 wherein the base plate has a top and bottom surface, the top surface having a length greater than a length of the bottom surface and the top surface having a first depth and the bottom surface having a second depth, wherein the first opening of the aperture of the rigid frame has a first depth corresponding to at least the first depth of the top surface of the base plate and having a second depth corresponding to at least the second depth of the bottom surface of the base plate, wherein the first depth of the first opening is substantially larger than the second depth of the second opening so as to insure the at least one power block protrudes from the bottom surface of the rigid frame so as to make contact with the heat sink.

13. The assembly as recited in claim 10 further comprising a mounting interface positioned in the at least one aperture for suspending the power block assembly in the rigid frame and forcing the power block assembly to protrude from a bottom surface of the rigid frame.

14. The assembly as recited in claim 13 wherein the mounting interface is a flexible gasket.

15. The assembly as recited in claim 13 wherein the mounting interface is at least one leaf spring.

16. The assembly as recited in claim 13 wherein the mounting interface is at least one spring pressure plate.

17. A method of making a substrate assembly for use in a high power switching module, the method comprising:

providing at least one power block assembly including a base plate providing mechanical rigidity for the power block assembly and at least one silicon die mounted onto the base plate and configured to form at least one high power switching transistor having leads extending away therefrom for interconnection with at least one other power block assembly to form the high power switching module, wherein the at least one high power switching transistor can be tested independently of other high power switching transistors;

providing a rigid frame having at least one aperture and having a top surface and a bottom surface, wherein each of the apertures include a first opening at the top surface and a second opening at the bottom surface, the first opening being slightly larger than the second opening; and inserting the at least one power block into the at least one aperture of the rigid frame.

18. The method as recited in claim 17 wherein providing the base plate includes providing a base plate having a top and bottom surface wherein each of the top and bottom surfaces have a length and depth the length of the top surface being longer than the length of the bottom surface and the depth of the top surface being greater than the depth of the bottom surface and wherein providing the rigid frame includes providing a rigid frame wherein the first opening has a first depth corresponding to at least the first depth of the top surface of the base plate and having a second depth corresponding to at least the second depth of the bottom surface of the base plate, wherein the first depth of the first opening is substantially larger than the second depth of the second opening so as to insure the at least one power block protrudes form the bottom surface of the rigid frame and the method further comprising mounting the rigid frame onto a heat dissipating surface so that the at least one power block assembly makes contact with the heat dissipating surface when mounted thereon.

* * * * *